(12) United States Patent  
Han et al.

(10) Patent No.: US 8,963,423 B2  
(45) Date of Patent: Feb. 24, 2015

(54) BARRIER FILM COMPOSITE, DISPLAY APPARATUS INCLUDING THE BARRIER FILM COMPOSITE, METHOD OF MANUFACTURING BARRIER FILM COMPOSITE, AND METHOD OF MANUFACTURING DISPLAY APPARATUS INCLUDING THE BARRIER FILM COMPOSITE

(71) Applicant: Samsung Display Co., Ltd., Yongin, Gyeonggi-Do (KR)

(72) Inventors: Dong-Won Han, Yongin (KR); Robert Jan Visser, San Jose, CA (US); Lorenza Moro, San Jose, CA (US)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/093,385

(22) Filed: Nov. 29, 2013

(65) Prior Publication Data

US 2014/0093700 A1 Apr. 3, 2014

Related U.S. Application Data

(62) Division of application No. 12/981,041, filed on Dec. 29, 2010, now Pat. No. 8,624,487.

(60) Provisional application No. 61/291,404, filed on Dec. 31, 2009.

(30) Foreign Application Priority Data

Dec. 6, 2010 (KR) ........................ 10-2010-0123482

(51) Int. Cl.
*H01L 51/50* (2006.01)
*H01L 51/52* (2006.01)
(Continued)

(52) U.S. Cl.
CPC ............ *H01L 51/5256* (2013.01); *H05B 33/04* (2013.01); *H01L 51/0097* (2013.01); *H01L 27/3244* (2013.01); *H01L 2251/5338* (2013.01); *Y02E 10/549* (2013.01)
USPC ........................... 313/512; 313/509; 313/506

(58) Field of Classification Search
CPC ................................. H01L 51/5237–51/5256
USPC .................................................. 313/500–512
See application file for complete search history.

(56) References Cited

U.S. PATENT DOCUMENTS

| 4,652,490 A | 3/1987 | Arita et al. |
| 5,260,095 A | 11/1993 | Affinito |

(Continued)

FOREIGN PATENT DOCUMENTS

| CN | 1627869 A | 6/2005 |
| CN | 1841811 A | 10/2006 |

(Continued)

OTHER PUBLICATIONS

Chinese Registration Determination Certificate issued by Chinese Intellectual Property Office on Apr. 16, 2014 in connection with Chinese Patent Application No. 201010624532.4 which also claims Korean Patent Application No. 10-2010-0123489 as its priority document.

(Continued)

*Primary Examiner* — Mariceli Santiago
(74) *Attorney, Agent, or Firm* — Robert E. Bushnell, Esq.

(57) ABSTRACT

A barrier film composite includes a film with an undulating surface; and at least one decoupling layer and at least one barrier layer disposed on the undulating surface of the film.

8 Claims, 7 Drawing Sheets

(51) Int. Cl.
*H05B 33/04* (2006.01)
*H01L 51/00* (2006.01)
*H01L 27/32* (2006.01)

(56) References Cited

U.S. PATENT DOCUMENTS

| | | | |
|---|---|---|---|
| 5,300,353 | A | 4/1994 | Yoshimura et al. |
| 5,395,644 | A | 3/1995 | Affinito |
| 5,440,446 | A | 8/1995 | Shaw et al. |
| 5,547,508 | A | 8/1996 | Affinito |
| 5,691,615 | A | 11/1997 | Kato et al. |
| 5,725,909 | A | 3/1998 | Shaw et al. |
| 5,902,641 | A | 5/1999 | Affinito et al. |
| 6,268,695 | B1 | 7/2001 | Affinito |
| 6,522,067 | B1 | 2/2003 | Graff et al. |
| 6,570,325 | B2 | 5/2003 | Graff et al. |
| 6,866,901 | B2 | 3/2005 | Burrows et al. |
| 7,198,832 | B2 | 4/2007 | Burrows et al. |
| 7,787,097 | B2 * | 8/2010 | Satoh .................. 349/158 |
| 7,868,545 | B2 * | 1/2011 | Hioki et al. ............ 313/511 |
| 2003/0164674 | A1 | 9/2003 | Imamura |
| 2003/0213956 | A1 * | 11/2003 | Hioki et al. ................ 257/59 |
| 2004/0119068 | A1 | 6/2004 | Weaver |
| 2005/0051763 | A1 | 3/2005 | Affinito et al. |
| 2005/0062052 | A1 | 3/2005 | Yang et al. |
| 2005/0127829 | A1 | 6/2005 | Takahashi |
| 2005/0176181 | A1 | 8/2005 | Burrows et al. |
| 2005/0224935 | A1 | 10/2005 | Schaepkens et al. |
| 2006/0072047 | A1 | 4/2006 | Sekiguchi |
| 2006/0159938 | A1 | 7/2006 | Lee et al. |
| 2006/0220548 | A1 | 10/2006 | Menda |
| 2006/0270305 | A1 | 11/2006 | Imamura |
| 2007/0164376 | A1 | 7/2007 | Burrows et al. |
| 2007/0196682 | A1 | 8/2007 | Visser et al. |
| 2007/0210459 | A1 | 9/2007 | Burrows et al. |
| 2007/0273972 | A1 | 11/2007 | Okayasu |
| 2007/0281174 | A1 | 12/2007 | Moro et al. |
| 2008/0176041 | A1 | 7/2008 | Sato et al. |
| 2009/0174924 | A1 | 7/2009 | Kubota |
| 2009/0208754 | A1 | 8/2009 | Chu et al. |
| 2009/0279285 | A1 | 11/2009 | Nakayama et al. |
| 2010/0089636 | A1 | 4/2010 | Ramadas et al. |
| 2010/0270919 | A1 | 10/2010 | Hubert et al. |
| 2012/0243092 | A1 * | 9/2012 | Muller ..................... 359/507 |

FOREIGN PATENT DOCUMENTS

| | | |
|---|---|---|
| EP | 1868256 | 12/2007 |
| JP | 60-187544 | 9/1985 |
| JP | 2-192691 | 7/1990 |
| JP | 2002-240862 | 8/2002 |
| JP | 2003336020 A * | 11/2003 |
| JP | 2005-026396 | 1/2005 |
| JP | 2005-111702 | 4/2005 |
| JP | 2005-251704 | 9/2005 |
| JP | 2006-094782 | 4/2006 |
| JP | 2006-114438 | 4/2006 |
| JP | 2006-127841 | 5/2006 |
| JP | 2006-297694 | 11/2006 |
| JP | 2008-279597 | 11/2008 |
| JP | 2009-193754 | 8/2009 |
| JP | 2009-252364 | 10/2009 |
| JP | 2009-259788 | 11/2009 |
| JP | 2010-052402 | 3/2010 |
| JP | 2011201043 A * | 10/2011 |
| KR | 10-2004-0015360 | 2/2004 |
| KR | 10-0576639 | 5/2006 |
| KR | 10-2006-0084659 | 7/2006 |
| KR | 10-2008-0009297 | 1/2008 |
| KR | 10-2010-0108392 | 10/2010 |
| TW | 200847841 A | 12/2008 |
| TW | 200930137 A | 7/2009 |

OTHER PUBLICATIONS

Extended European Search Report issued by EPO on Jul. 28, 2011 in European Patent Application No. 10252255.4 corresponding to Cross-referenced U.S. Appl. No. 12/981,353.

Korean Office Action issued by KIPO on Aug. 3, 2012 in Korean Patent Application No. 10-2010-0123482 corresponding to U.S. Appl. No. 12/981,041.

Japanese Office Action issued by JPO on Jun. 26, 2012 in Japanese Patent Application No. 2010-292574 corresponding to U.S. Appl. No. 12/981,041.

Extended European Search Report issued by EPO on Feb. 28, 2013 in European Patent Application No. 10252256.2 corresponding to U.S. Appl. No. 12/981,041.

Extended European Search Report issued by EPO on Feb. 25, 2013 in European Patent Application No. 10252257.0 corresponding to Cross-referenced U.S. Appl. No. 12/981,045.

Japanese Office Action issued by JPO on Sep. 3, 2013 in Japanese Patent Application No. 2010-293239 corresponding to Cross-referenced U.S. Appl. No. 12/981,045.

Japanese Office Action issued by JPO on Sep. 3, 2013 in Japanese Patent Application No. 2010-293907 corresponding to Cross-referenced U.S. Appl. No. 12/981,353.

Taiwanese Office Action issued by the Taiwan Patent Office on Dec. 5, 2013 in connection with Taiwanese Patent Application No. 99146959 which also claims Korean Patent Application No. 10-2010-0123483 as its priority document.

European Office Action issued on Jul. 14, 2014 by EPO in connection with corresponding European Patent Application No. 10252257.0.

Taiwanese Office Action issued by the Taiwan Patent Office on Dec. 3, 2013 in connection with Taiwanese Patent Application No. 99146961 which also claims Korean Patent Application No. 10-2010-0123482 as its priority document and Request for Entry of the Accompanying Office Action attached herewith.

* cited by examiner

BARRIER FILM COMPOSITE, DISPLAY APPARATUS INCLUDING THE BARRIER FILM COMPOSITE, METHOD OF MANUFACTURING BARRIER FILM COMPOSITE, AND METHOD OF MANUFACTURING DISPLAY APPARATUS INCLUDING THE BARRIER FILM COMPOSITE

CROSS-REFERENCE TO RELATED APPLICATIONS AND CLAIM OF PRIORITY

This application is a divisional application of the prior application Ser. No. 12/981,041 filed in the U.S. Patent & Trademark Office on 29 Dec. 2010 and assigned to the assignee of the present invention. Furthermore, this application makes reference to, incorporates the same herein, and claims all benefits accruing under 35 U.S.C. §119 from a provisional application earlier filed in the U.S. Patent & Trademark Office on 31 Dec. 2009 and there duly assigned Ser. No. 61/291,404, and an application earlier filed in the Korean Intellectual Property Office on 6 Dec. 2010 and there duly assigned Serial No. 10-2010-0123482.

BACKGROUND OF THE INVENTION

1. Field of the Invention

Embodiments of the present invention relate to a barrier film composite, a display apparatus including the same, a method of manufacturing the barrier film composite, and a method of manufacturing the display apparatus including the barrier film composite.

2. Description of the Related Art

Multilayered thin film barrier composites having alternating layers of barrier material and decoupling material are well known. These barrier composites are typically formed by depositing alternating layers of barrier material and decoupling material, for example, by vapor deposition. Each of the barrier layers is typically a few hundred Angstroms thick, while each of the decoupling layers is generally less than ten microns thick.

There is demand for stretchable multilayer barrier film composites, methods of forming such composites, display apparatuses including such a barrier film composite, and methods of manufacturing display apparatuses including such a barrier film composite.

SUMMARY OF THE INVENTION

Embodiments of the present invention provide a stretchable barrier film composite, a display apparatus including the stretchable barrier film, and methods of manufacturing the barrier film composite and the display apparatus including the barrier film composite.

In accordance with an aspect of the present invention, a barrier film composite may include a film with an undulating surface; and at least one decoupling layer and at least one barrier layer disposed on a surface of the film.

The film may include a stretchable material.

The film may include at least one selected from the group consisting of polyethylene, polypropylene, polycarbonate, and combinations thereof.

The film may include a first layer that is stretchable, and a second layer disposed on the first layer with an undulating surface.

The first layer may include plastic, and the second layer may include a soft monomer.

The barrier film composite may include alternating layers of the at least one decoupling layer and at least one barrier layer.

The at least one decoupling layer may include a cross-linked material with a low glass transition temperature.

The decoupling layer may include an acrylate.

The barrier layer may include at least one selected from the group consisting of individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof.

In accordance with another aspect of the present invention, a display apparatus may include a first substrate; a second substrate disposed opposite to and spaced apart from the first substrate; and a light-emitting device between the first substrate and the second substrate, wherein at least one of the first substrate and the second substrate includes the barrier film composite of any one of the embodiments described above.

The light-emitting device may include an organic light-emitting device.

In accordance with another aspect of the present invention, a method of manufacturing a barrier film composite may include steps of providing a film having an undulating surface; and disposing at least one decoupling layer and at least one barrier layer having an undulating structure on a surface of the film.

The method may further include providing a mold having an undulating surface, wherein at least one decoupling layer and at least one barrier layer are formed on the undulating surface of the mold, and a film is formed on a surface of the at least one decoupling layer and at least one barrier layer.

The mold with the undulating surface may be formed by applying embossing or photolithography on an original mold having a flat surface.

The adhesion between the undulating surface of the mold and either the decoupling layer or the barrier layer that is in direct contact with the mold may be weaker than the adhesion between the film and the surface of the decoupling layer and barrier layer that is in direct contact with the film.

The method may further include releasing the mold from the decoupling layer and the barrier layer, after the forming of the film.

The providing of the film may include forming a first layer; and forming a second layer on the first layer. The combination of the first and second layers are subjected by an irradiation in order to obtain an undulating surface of the second layer.

The first irradiation may include laser writing or irradiation through a mask.

The method may further include fixing and firming the undulating surface of the second layer by a second irradiation.

In accordance with another aspect of the present invention, a method of manufacturing a display apparatus including the barrier film composite of any one of the embodiments described above, may include steps of providing a first substrate and a second substrate opposite to and spaced apart from each other; and disposing a light-emitting device between the first substrate and the second substrate.

The light-emitting device may include an organic light-emitting device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
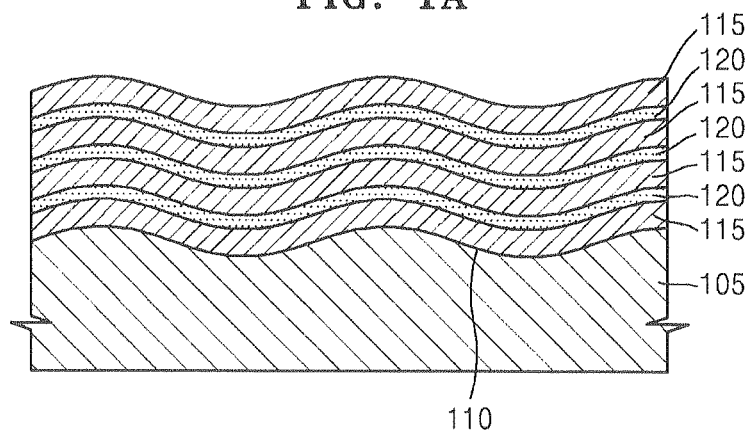
FIGS. 1A to 1C are cross sectional views illustrating a barrier film composite and a method of manufacturing the barrier film composite, according to an embodiment of the present invention.

A film having multilayer barrier coating creates a barrier film with unsurpassed barrier performance, is described in U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; U.S. Pat. No. 6,570,325, entitled "Environmental Barrier Material For Organic Light Emitting Device And Method Of Making", issued May 27, 2003; U.S. Pat. No. 6,866,901, entitled "Method for Edge Sealing Barrier Films", issued Mar. 15, 2005; U.S. Pat. No. 7,198,832, entitled "Method for Edge Sealing Barrier Films", issued Apr. 3, 2007; U.S. patent application Ser. No. 11/068,356, entitled "Method for Edge Sealing Barrier Films", filed Feb. 28, 2005; U.S. patent application Ser. No. 11/693,020, entitled "Method for Edge Sealing Barrier Films", filed Mar. 29, 2007; and U.S. patent application Ser. No. 11/693,022, entitled "Method for Edge Sealing Barrier Films", filed Mar. 29, 2007; U.S. patent application Ser. No. 11/776,616, entitled "Multilayer Barrier Stacks and Methods of Making Multilayer Barrier Stacks," filed Jul. 12, 2007; each of which is incorporated herein by reference.

The number of barrier stacks is not limited. The number of barrier stacks needed depends on the substrate material used and on the level of permeation resistance needed for the particular application. One or two barrier stacks may provide sufficient barrier properties for some applications. The most stringent applications may require five or more barrier stacks.

The barrier stacks may include at least one decoupling layer and at least one barrier layer. There may be one decoupling layer and one barrier layer, there may be at least one decoupling layer disposed on one side of at least one barrier layer, there may be at least one decoupling layer disposed on both sides of at least one barrier layer, or there may be at least one barrier layer disposed on both sides of at least one decoupling layer. A barrier stack may include at least one decoupling layer and at least one barrier layer. The barrier layers in the barrier stacks may be made of the same material or of a different material as each other, and the decoupling layers may also be made of the same material or of a different material as each other.

Each of the barrier layers may be typically about 100 to about 2000 Å thick. In some embodiments a first barrier layer which is first formed among all battier layers may be thicker than later barrier layers which are later formed among all battier layers in comparison with the first barrier layer, if desired. For example, the first barrier layer may have a thickness of about 1000 Å to about 1500 Å, while later barrier layers may have a thickness of about 400 Å to about 500 Å. In some other embodiments, the first barrier layer may be thinner than later barrier layers. For example, the first barrier layer may have a thickness of about 100 Å to about 400 Å, while later barrier layers may have a thickness of about 400 Å to about 500 Å. The decoupling layers may be typically about 0.1 to about 10 µm thick. In some embodiments the first decoupling layer may be thicker than later decoupling layers, if desired. For example, the first decoupling layer which is first formed among all decoupling layers may have a thickness of about 3 µm to about 5 µm, while later decoupling layers which are later formed among all decoupling layers in comparison with the first decoupling layer may have a thickness of about 0.1 µm to about 2 µm.

The barrier stacks may include the same or different layers, and the layers may be arranged in the same or different sequences.

The decoupling layers may be made from the same decoupling material or different decoupling materials. The decoupling layers may be made of at least one selected from among, but not limited to, organic polymers, polymers including inorganic elements, organometallic polymers, hybrid organic/inorganic polymer systems, and combinations thereof. The organic polymers may be at least one selected from among, but not limited to, urethanes, polyamides, polyimides, polybutylenes, isobutylene isoprene, polyolefins, epoxies, parylenes, benzocyclobutadiene, polynorbornenes, polyarylethers, polycarbonates, alkyds, polyaniline, ethylene vinyl acetate, ethylene acrylic acid, and combinations thereof. The polymers including inorganic elements may be at least one selected from among, but not limited to, silicones, polyphosphazenes, polysilazanes, polycarbosilanes, polycarboranes, carborane siloxanes, polysilanes, phosphonitriles, sulfur nitride polymers, siloxanes, and combinations thereof. The organometallic polymers may be at least one selected from among, but not limited to, organometallic polymers of main group metals, transition metals, and lanthanide/actinide metals, and combinations thereof. The hybrid organic/inorganic polymer systems may be at least one selected from among, but not limited to, organically modified silicates, preceramic polymers, polyimide-silica hybrids, (meth)acrylate-silica hybrids, polydimethylsiloxane-silica hybrids, and combinations thereof.

The barrier layers may be made from the same barrier material or different barrier materials. The barrier layers may be made of any suitable barrier material. Suitable inorganic materials based on metals may be at least selected from among, but not limited to, individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof. The metals may be at least one selected from among, not limited to, transition ("d" block) metals, lanthanide ("f" block) metals, aluminum, indium, germanium, tin, antimony and bismuth, and combinations thereof. Many of the resultant metal based materials will be conductors or semiconductors. The fluorides and oxides may be at least one selected from among, but not limited to, dielectrics (insulators), semiconductors and metallic conductors. The conductive oxides may be at least one selected from among, but not limited to, aluminum doped zinc oxide, indium tin oxide (ITO), antimony tin oxide, titanium oxides ($TiO_x$ where $0.8 \leq x \leq 1$), and tungsten oxides ($WO_x$ where $2.7 \leq x < 3.0$). Suitable inorganic materials based on "p" block semiconductors and non-metals may be at least one selected from among, but not limited to, silicon, silicon compounds, boron, boron compounds, carbon compounds including amorphous carbon and diamond-like carbon, and combinations thereof. The silicon compounds may be at least one selected from among, but not limited to, silicon oxides ($SiO_x$ where $1 \leq x \leq 2$), polysilicic acids, alkali and alkaline earth silicates, aluminosilicates ($Al_xSiO_y$), silicon nitrides ($SN_xH_y$ where $0 \leq y < 1$), silicon oxynitrides ($SiN_xO_yH$, where $0 \leq z < 1$), silicon carbides ($SiC_xH_y$ where $0 \leq y < 1$), and silicon aluminum oxynitrides (SiAlONs). The boron compounds may be at least one selected from among, but not limited to, boron carbides, boron nitrides, boron oxynitrides, boron carbonitrides, and combinations thereof.

The barrier layers may be deposited by using any suitable process including, but not limited to, contemporary vacuum processes such as sputtering, evaporation, sublimation, chemical vapor deposition (CVD), plasma enhanced chemical vapor deposition (PECVD), electron cyclotron resonance-plasma enhanced vapor deposition (ECR-PECVD), and combinations thereof.

The decoupling layers may be produced by using a number of known processes which provide improved surface planarity, including both atmospheric processes and vacuum processes. The decoupling layers may be formed by depositing a layer of liquid and subsequently processing the layer of liquid into a solid film. Depositing the decoupling layers as a liquid allows the liquid to flow over and to compensate the defects in the substrate or a previous layer, fill in lower areas, and cover up higher points, providing a surface with significantly improved planarity. When the decoupling layers is processed into a solid film, the improved surface planarity is retained. Suitable processes for depositing a layer of liquid material and processing it into a solid film include, but are not limited to, vacuum processes and atmospheric processes. Suitable vacuum processes include, but are not limited to, those described in U.S. Pat. Nos. 5,260,095, 5,395,644, 5,547,508, 5,691,615, 5,902,641, 5,440,446, and 5,725,909, which are incorporated herein by reference. Liquid spreading apparatuses described in U.S. Pat. Nos. 5,260,095, 5,395,644, and 5,547,508, which are incorporated herein by reference, may be further configured to print liquid monomer in discrete, precisely placed regions of the receiving substrate.

Suitable atmospheric processes include, but are not limited to, spin coating, printing, ink jet printing, and/or spraying. Atmospheric processes refer to processes that run at pressures of about 1 atmosphere and can employ the ambient atmosphere. The use of atmospheric processes presents a number of difficulties including the need to cycle between a vacuum environment for depositing the barrier layer and ambient conditions for the decoupling layer, and exposure of the environmentally sensitive device to environmental contaminants, such as oxygen and moisture. One way to alleviate these problems is to use a specific gas (purge gas) during the atmospheric process to control exposure of the receiving substrate to the environmental contaminants. For example, the process may include cycling between a vacuum environment for barrier layer deposition and an ambient pressure nitrogen environment for the atmospheric process. Printing processes, including ink jet printing, allow the deposition of the decoupling layer in a precise area without the use of masks.

One way to make a decoupling layer involves depositing a polymer precursor, such as a (meth)acrylate containing polymer precursor, and then polymerizing it in situ to form the decoupling layer. As used herein, the term "polymer precursor" means a material which may be polymerized to form a polymer, including, but not limited to, monomers, oligomers, and resins. As another example of a method of making a decoupling layer, a preceramic precursor may be deposited as a liquid by spin coating and then be converted to a solid layer. Full thermal conversion is possible for a film of this type directly on a glass or oxide coated substrate. Although the preceramic precursor sometimes cannot be fully converted to a ceramic at temperatures compatible with some flexible substrates, partial conversion to a cross-lined network structure would be satisfactory. Electron beam techniques may be used to crosslink and/or densify some of these types of polymers and may be combined with thermal techniques to overcome some of the substrate thermal limitations, provided the substrate may handle the electron beam exposure. Another example of making a decoupling layer involves depositing a material, such as a polymer precursor, as a liquid at a temperature above its melting point and subsequently freezing it in place.

One method of making a barrier film composite includes providing a substrate, and depositing a barrier layer adjacent to the substrate at a barrier deposition station. The substrate with the barrier layer may be moved to a decoupling material deposition station. A mask is provided with an opening which limits the deposition of the decoupling layer to an area which is smaller than, and contained within, the area covered by the barrier layer. The first layer deposited may be either the barrier layer or the decoupling layer, depending on the design of the composite.

These multilayer, barrier coatings and barrier films are relatively flexible. These multilayer, barrier coatings and barrier films typically start cracking only when they are wrapped over a 7 mm radius spindle. For example, the thin (about 60 nm) aluminum oxide barrier layers in the barrier coating start showing cracks around a 0.75% tensile strain. While optimization of the adhesion and materials might be able to shift the threshold of first cracks to higher values, it is unlikely that such a multilayer barrier film could be stretched to several percent elongation.

The pristine multilayer barrier film has been shown to be almost stress free (the tensile stress of the aluminum oxide layers is only 470 MPa, and the tensile stress of the polymers layers is even lower), resulting in processed films which are flat and which do not curl under heat treatment.

The barrier properties of the pristine multilayer barrier films have been shown to have a water vapor transmission rate (WVTR) of $1\times10^{-6}$ g/m$^2$/day.

The application of such stretchable barrier films may be to protect a wide range of environmentally sensitive materials and objects, ranging from flexible displays and solar cells to car bumpers used for corrosion protection and medical applications.

Instead of applying a wet or spray coating to a three dimensional object (paint for instance), more and more industries prefer a moldable coating which may be wrapped on the object (e.g., a car bumper) without the manufacturing company having to conduct wet processing with environmentally unfriendly chemicals and having to deal with the resulting contaminant and waste effluent problems.

Another application of stretchable barrier film composites is to be used as a barrier coating on the exterior of a three dimensional object, which may be created by putting a barrier film in a mold and injecting plastic into the mold.

Medical packaging for individual pills pockets using the multilayer barrier film is another potential application of stretchable barrier film composites.

There are a number of ways to realize such structures. These methods make use of the flexibility of the barrier layer or take into account that the barrier layers break on stretching.

One aspect of the invention is either to prevent barrier layers from cracking or to minimize and compensate for cracks. The resulting barrier might not meet a WVTR of $1\times10^{-6}$ g/m$^2$/day, but it may still have a good WVTR that is about 100 times better than a homogenous barrier film such as a polychlorotrifluoroethylene film (e.g., ACLAR® film available from Honeywell International, Inc.).

Figure 1B:
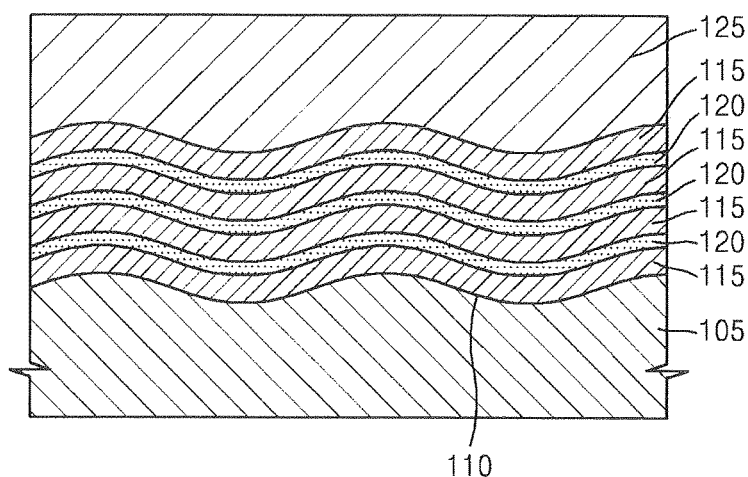
Figure 1C:
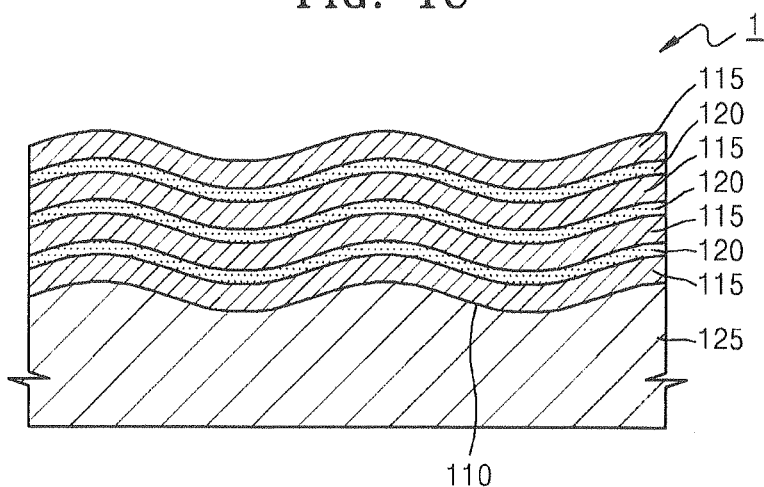

FIGS. 1A to 1C illustrate a barrier film composite 1 and a method of manufacturing the barrier film composite 1, according to an embodiment of the present invention.

Referring FIG. 1A, a mold 105 is provided with an undulating surface. The mold 105 having the undulating surface 110 may be formed by performing embossing or photolithography on an original mold having a flat surface.

Decoupling layers 115 and barrier layers 120 may be alternately formed to conform to the surface of the mold 105. The decoupling layers 115 and the barrier layers 120 form a very soft, elastic undulating structure, which is stretchable. In particular, a decoupling layer 115 is coated on the surface 110 of the mold 105, and a barrier layer 120 is then sputtered over and conforms to the decoupling layer 115. Although FIGS. 1A to 1C illustrate that the decoupling layer 115 is directly disposed on the surface 110 of the mold 105, the deposition order of the decoupling layer 115 and the barrier layer 120 may be reversed. The decoupling layers 115 may include, but are not limited to, cross-linked acrylates with low glass transition temperatures (Tg), for example, ranging from about −80° C. to about 40° C. This process may be repeated as many times as necessary, forming alternating layers of decoupling layers 115 and barrier layers 120 conforming to one another.

Referring to FIG. 1B, a film 125 may be laminated on a surface of the alternating decoupling layers 115 and barrier layers 120. The film 125 also has an undulating surface due to the undulating structure of the decoupling layers 115 and barrier layers 120. The film 125 may be formed from a stretchable material. Thus, the film 125 has a stretchable structure. The film 125 may include, but is not limited to, at least one selected from among polyethylene, polypropylene, polycarbonate, and combinations thereof.

Referring to FIG. 1C, the mold 105 is released from a barrier film composite 1 that includes the alternating layers of decoupling layers 115 and barrier layers 120, and the film 120. In order to facilitate the release of the mold 105 from the barrier film composite 1, the adhesion between the surface 110 of the mold 105 and the layer in direct contact with the surface 110 may be weaker than the adhesion between the film 125 and the alternating layers of decoupling layers 115 and barrier layers 120.

As a result, the barrier film composite 1, including the alternating layers of decoupling layers 115 and barrier layers 120, released from the mold 105 may provide a very soft, elastic polymer-based structure with an undulating surface. Instead of using wet or spay coating, the undulating structure is created using molding with the mold 105, thereby alleviating environmental problems.

Figure 10A:
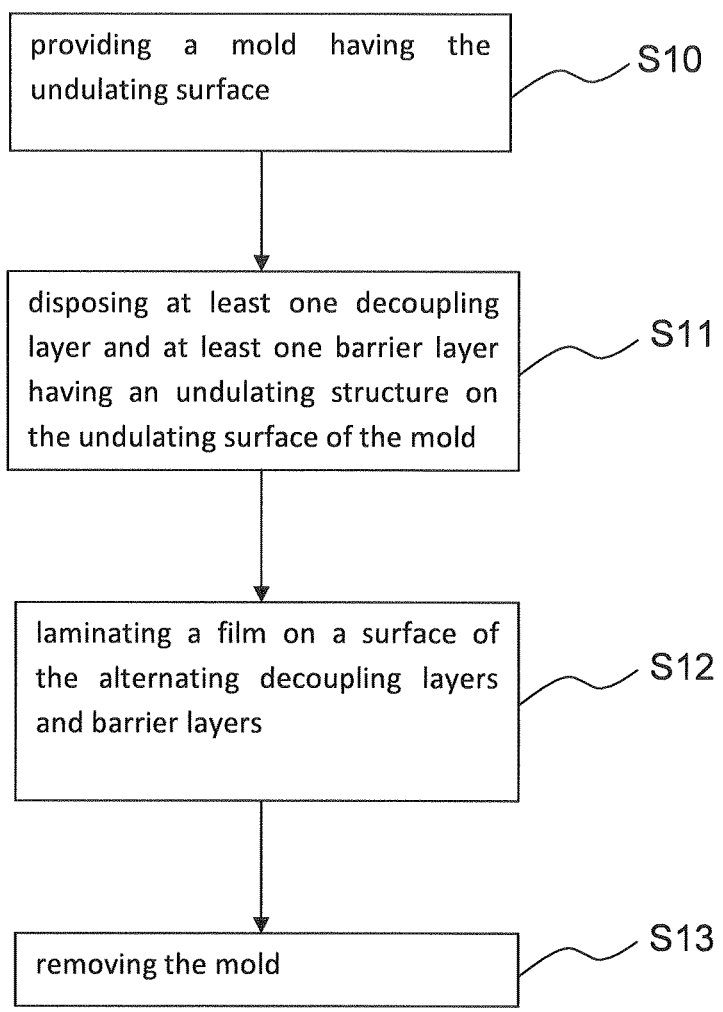
FIG. 10A is a flow chart showing a method of manufacturing the barrier film composite of FIGS. 1A to 1C.

FIG. 10A is a flow chart showing a method of manufacturing the barrier film composite according one embodiment. The method may include steps of providing a mold having an undulating surface (S10), disposing at least one decoupling layer and at least one barrier layer having an undulating structure on the undulating surface of the mold (S11), laminating a film on a surface of the alternating decoupling layers and barrier layers (S12), and removing the mold (S13). The film may have a flat exposed surface.

Figure 2:
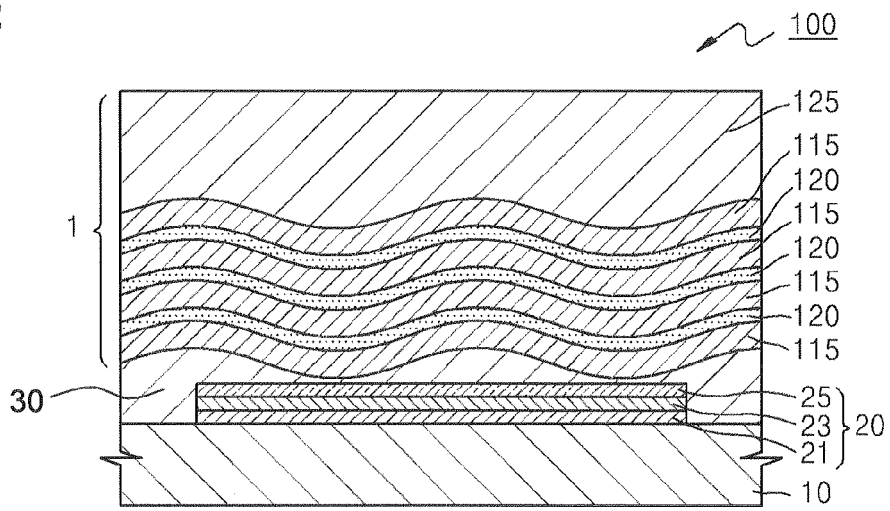
FIG. 2 is a cross sectional view illustrating an organic light-emitting display apparatus including the barrier film composite of FIG. 1C, according to an embodiment of the present invention.

FIG. 2 illustrates an organic light-emitting display apparatus 100 including the barrier film composite 1 of FIG. 1C, according to an embodiment of the present invention.

As described above, the barrier film composite 1 may be used with environmentally sensitive materials or objects, and may be used in a flexible display apparatus. Organic light-emitting display apparatuses include organic emission layers that are vulnerable to oxygen and moisture, and there is also an increasing demand for flexible display apparatuses as next-generation display apparatuses.

Referring to FIG. 2, the organic light-emitting display apparatus 100 includes an organic light-emitting device 20 on a surface of a substrate 10, and the barrier film composite 1, which encapsulates the organic light-emitting device 20. Although FIG. 2 illustrates an exemplary application of the barrier film composite 1 as an encapsulating material for the organic light-emitting device 20, aspects of the present invention are not limited thereto. The barrier film composite 1 may also be used as the substrate 10. When the barrier film composite 1 is used only to encapsulate the organic light-emitting device 20, the substrate 10 may include a flexible material, such as plastics or polyimides.

The organic light-emitting device 20 includes a first electrode layer 21, an organic emission layer 23, and a second electrode layer 25.

The first electrode layer 21 and the second electrode layer 25 may be used as either an anode or a cathode, and may each be used as one of a reflective electrode, a transparent electrode, and a semi-transparent electrode.

The organic emission layer 23 may include a low-molecular weight organic material or a large-molecular weight organic material. When the organic emission layer 23 includes a low-molecular weight organic material, a hole transport layer (HTL) and a hole injection layer (HIL) may be sequentially disposed on a surface of the organic emission layer 23, and an electron transport layer (ETL) and an electron injection layer (EIL) may be sequentially disposed on the opposite surface thereof. Other various kinds of layers may be further laminated, if needed. Examples of suitable low-molecular weight organic materials include copper phthalocyanine (CuPc), N'-di(naphthalene-1-yl)-N,N'-diphenyl-benzidine (NPB), tris-8-hydroxyquinoline aluminum (Alq3), and the like. When the organic emission layer 23 includes a large-molecular weight material, a HTL may be further included, in addition to the organic emission layer 23. The HTL may be formed from poly-(2,4)-ethylene-dihydroxy thiophene (PEDOT), polyaniline (PANI), or the like. Examples of suitable large-molecular weight organic materials include polyphenylenevinylenes (PPV), polyfluorenes, and the like.

The organic light-emitting display device 100 including the barrier film composite 1 as described above may have a soft, elastic structure, enabling the manufacture of a flexible display. The barrier film composite 1 does not crack or is less likely to crack, and thus may protect the organic emission layer 23 from external moisture and oxygen.

The organic light-emitting display apparatus 100 may further include the layer 30 which is disposed between the organic light-emitting device 20 and the barrier film composite 1. The layer 30 may be a flexible layer which may deform in order to conform to the undulating surface of the decoupling layer 115.

Although the current embodiment has been described focusing on an organic light-emitting display apparatus, aspects of the present invention are not limited thereto. That is, the barrier film composite 1 may be used in various types of display apparatuses.

Figure 11:
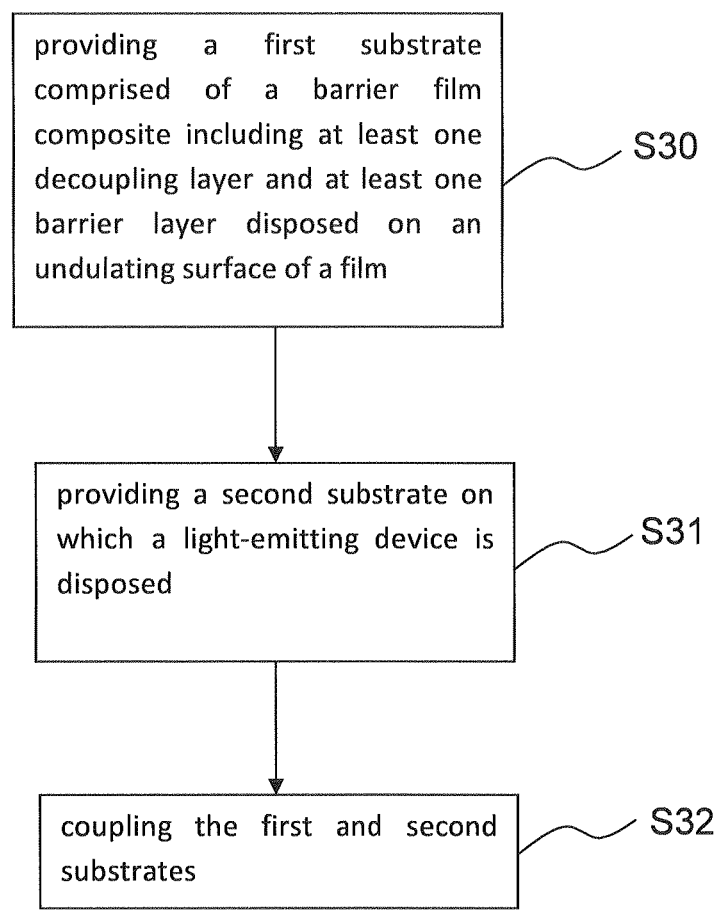
FIG. 11 is a flow chart showing a method of manufacturing the display apparatus of FIG. 2.

FIG. 11 is a flow chart showing a method of manufacturing an OLED device. This method includes steps of providing a first substrate comprised of a barrier film composite including at least one decoupling layer and at least one barrier layer disposed on a surface of the film (S30), providing a second substrate on which a light-emitting device is disposed (S31), and coupling the first and second substrates (S32).

Figure 3A:
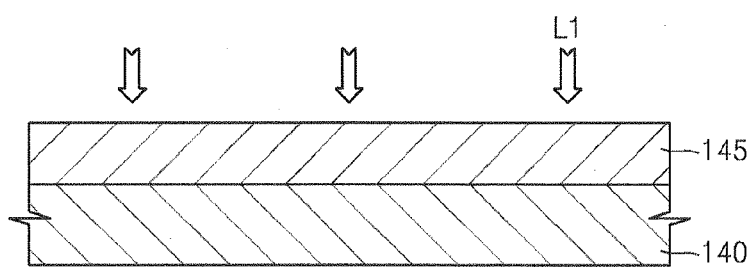
FIGS. 3A to 3C are cross sectional views illustrating a barrier film composite and a method of manufacturing the barrier film composite, according to another embodiment of the present invention.
Figure 3B:
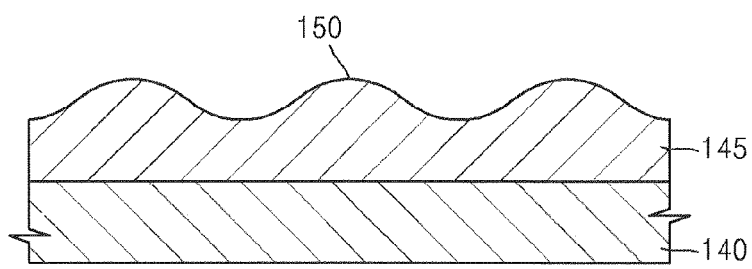
Figure 3C:
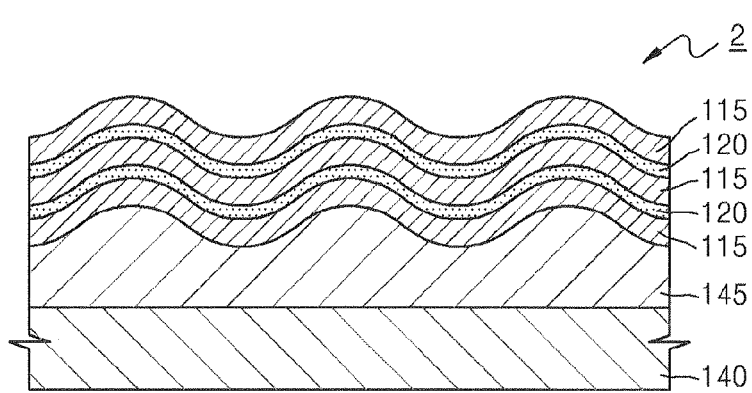

FIGS. 3A to 3C illustrate a barrier film composite 2 and a method of manufacturing the barrier film composite 2, according to another embodiment of the present invention.

Referring to FIG. 3A, a second layer 145 is formed on a first layer 140, and parts thereof are subjected to first irradiation (L1). The first layer 140 may include a flexible material, such as plastic. The second layer 145 may include a soft monomer with a low glass transition temperatures (Tg). Suitable soft monomers may include longer-chain alkyl acrylates, such as n-butyl acrylate, 2-ethyl hexyl acrylate, and iso-octyl acrylate. The first irradiation L1 may be laser writing, or irradiation through a mask.

Referring to FIG. 3B, as a result of the first irradiation (L1), the second layer 145 has an undulating surface 150. One surface of the second layer 145 exposed to the first irradiation (L1) partially shrinks or expands resulting in an undulating surface, and the one surface of the second layer 145 is then fixed and firmed and consolidated by a second irradiation (not shown), resulting in the undulating surface 150.

Referring to FIG. 3C, alternating layers of decoupling layers 115 and barrier layers 120 are laminated on the undulating surface 150 of the second layer 145, as in the previous embodiment described above. The undulating surface 150 of the second layer 145 is transferred to the alternating layers of decoupling layers 115 and barrier layers 120, causing one surface thereof to undulate.

The first layer 140, the second layer 145 disposed on the first layer 140 with the undulating surface 150, and the undulating alternating layers of decoupling layers 115 and the barrier layers 120, as described above, form the barrier film composite 2, which may provide a very soft, elastic polymer-based undulating structure. Instead of using wet or spay coating, the undulating structure is created with light irradiation as described above, thereby alleviating environmental problems.

Figure 10B:
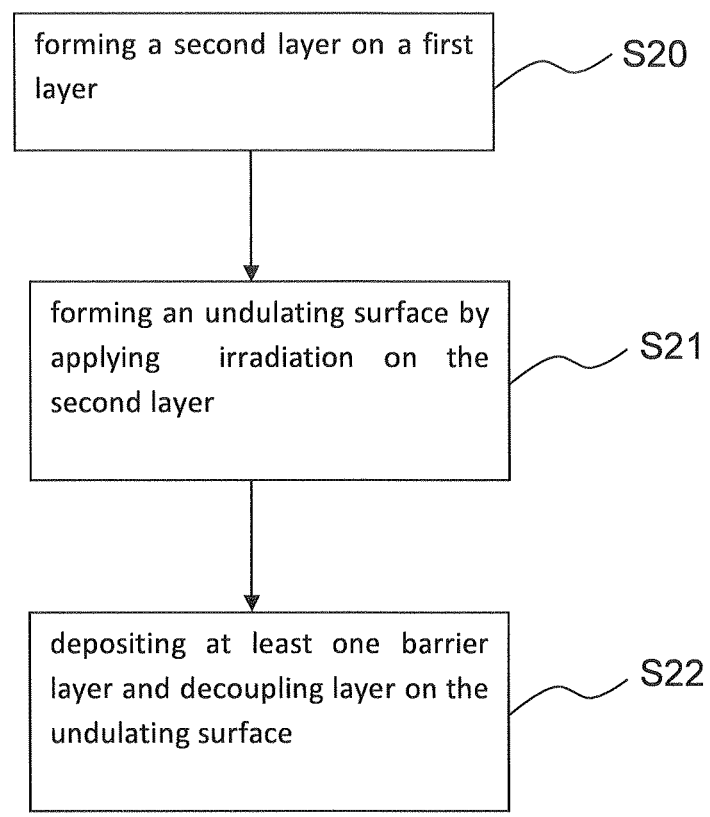
FIG. 10B is a flow chart showing a method of manufacturing the barrier film composite of FIGS. 3A to 3C.

FIG. 10B is a flow chart showing a method of manufacturing the barrier film composite according another embodiment. The method includes steps of forming a second layer on a first layer (S20), forming an undulating surface by applying irradiation on the second layer (S21), and depositing at least one barrier layer and decoupling layer on the undulating surface (S22).

Figure 4:
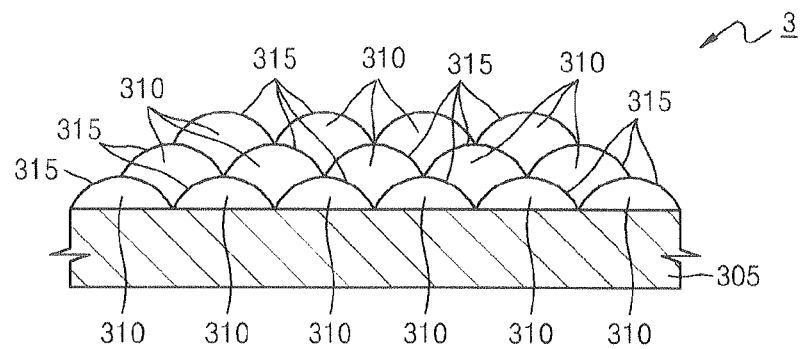
FIG. 4 is a cross sectional view illustrating a barrier film composite constructed as another embodiment of the present invention.

FIG. 4 illustrates a barrier film composite 3 according to another embodiment of the present invention.

A method of manufacturing a three-dimensional barrier, as described in U.S. application Ser. No. 11/627,583, filed Jan. 26, 2007 entitled "Three Dimensional Multilayer Barrier And Method Of Making", which is incorporated herein by reference.

Referring to FIG. 4, bubbles of polymer material 310 are surrounded by barrier material 315. The polymer material 310 is soft and stretchable. When stretched, most of the bubbles will elongate, but not break. While some bubbles may break, this will not provide a direct path to the outside because the break may be covered by other bubbles.

Figure 5A:
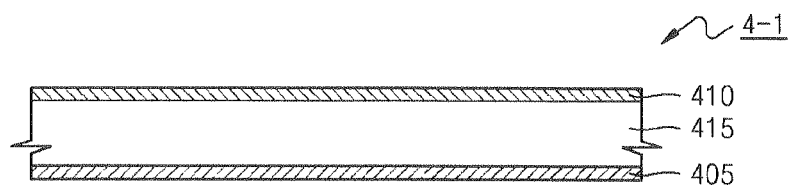
FIGS. 5A and 5B are cross sectional views illustrating barrier film composites constructed as other embodiments of the present invention.
Figure 5B:
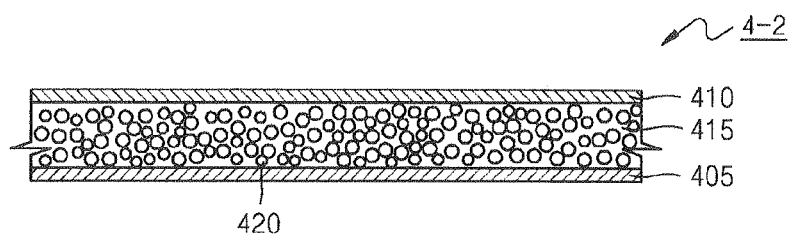

FIGS. 5A and 5B illustrate barrier film composites 4-1 and 4-2, respectively, according to other embodiments of the present invention.

Referring to FIG. 5A, the barrier film composite 4-1 includes double barrier layers 405 and 410. Instead of a single barrier layer in the multiplayer structure, the double barrier layers 405 and 410 are spaced apart from each other by a thin layer (about 10 nm to about 100 nm thick) of rubbery stretchable polymer 415. Suitable rubbery stretchable polymers include, but are not limited to, cross-linked acrylates with low Tg.

Referring to FIG. 5B, the barrier film composite 4-2 may include a getter material 420 dispersing within the polymer layer 415. The particle size (diameter) of the getter material 420 may be on a nanometer scale, for example, may be from about 1 nm to about 100 nm. Alternatively, the rubbery, stretchable polymer layer 415 may contain inorganic oxide or nitride particles to create a tortuous path for moisture.

Figure 6:
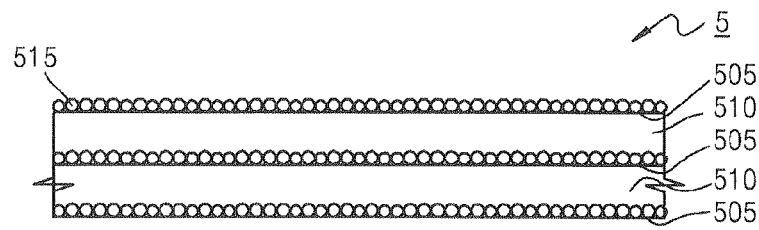
FIG. 6 is a cross sectional view illustrating a barrier film composite constructed as another embodiment of the present invention.

FIG. 6 illustrates a barrier film composite 5 according to another embodiment of the present invention.

Referring to FIG. 6, the barrier film composite 5 includes alternating layers of inorganic barrier layers 505 and decoupling layers 510. Each of the inorganic barrier layers 505 is covered by a thin layer of getter material 515. When stretched, the inorganic barrier layers 505 may crack, but the getter layer 515 will reduce the impact of the cracks.

Figure 7:
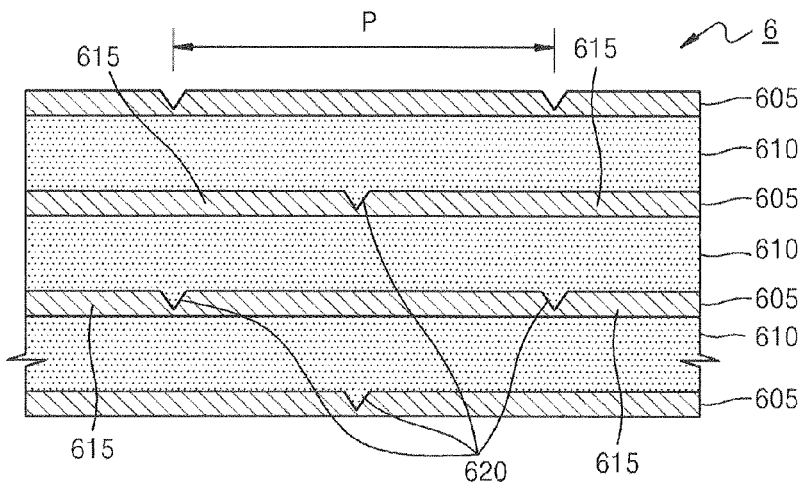
FIG. 7 is a cross sectional view illustrating a barrier film composite constructed as another embodiment of the present invention.

FIG. 7 illustrates a barrier film composite 6 according to another embodiment of the present invention.

Referring to FIG. 7, the barrier film composite 6 includes alternating layers of barrier layers 605 and decoupling layers 610.

The barrier materials 605 may include inorganic materials, and in some embodiments, may include at least one material selected from among individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof, as listed above.

Each of the barrier layers 605 includes a first region 615, and a second region 620 that has thinner thickness in comparison with the first region 615. The second region 620 has less mechanical strength in comparison with the first region 615. When the barrier film composite 6 is stretched, the second region 620 alleviates stress and helps the barrier film composite 6 elongate.

The first region 615 and the second region 620 may be formed from the same material. In one embodiment the first region 615 and the second region 620 may be formed from different materials. For example, the second region 620 may include a material having smaller mechanical strength in comparison with a material forming the first region 615.

The second region 620 may have varying thicknesses. As illustrated in FIG. 7, the thickness of the second region 620 may decrease toward a center of the second region 620 from sides of the second region 620 with a wedged cross-section. However, aspects of the present invention are not limited thereto.

Each of the barrier layers 605 may include a plurality of second regions 620. A pitch between each two adjacent second regions 620 may be same. However, aspects of the present invention are not limited thereto. The plurality of second regions 620 may be formed with a shadow mask. However, aspects of the present invention are not limited thereto.

In the barrier film composite 6 with the plurality of barrier layers 605, the second regions 620 in each barrier layer 605 may be positioned so as not to overlap with those in adjacent barrier layers 605.

Thus, even if cracking occurs when the barrier film composite 6 is stretched, the barrier layers 605, including the second regions 620, may reduce the impact of the cracks, since the pitch P between each two adjacent second regions 620 in each barrier layer 605 is also extended, thereby elongating potential external contamination paths, which may be formed by the second regions 620.

Figure 8:
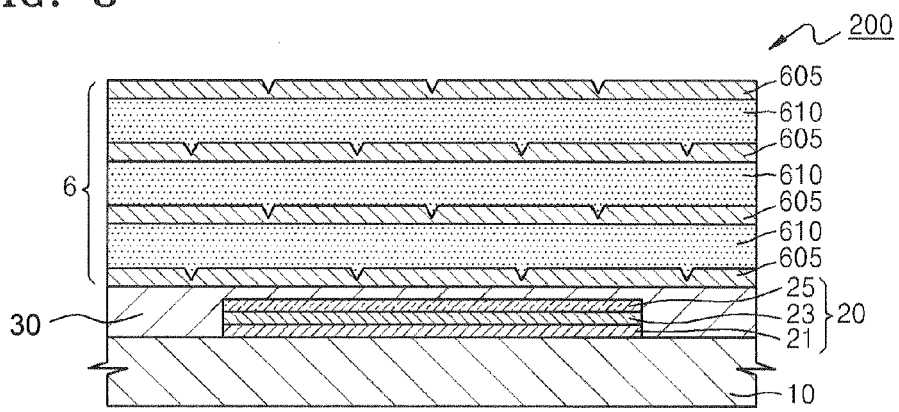
FIG. 8 is a cross sectional view illustrating an organic light-emitting display apparatus including the barrier film composite of FIG. 7, according to an embodiment of the present invention.

FIG. 8 illustrates an organic light-emitting display apparatus 200 including the barrier film composite 6 of FIG. 7, according to another embodiment of the present invention.

Referring to FIG. 8, the organic light-emitting display apparatus 200 includes an organic light-emitting device 20 on a surface of a substrate 10, and the barrier film composite 6, which encapsulates the organic light-emitting device 20. Although FIG. 8 illustrates an exemplary application of the barrier film composite 6 as an encapsulating material for the organic light-emitting device 20, aspects of the present invention are not limited thereto. The barrier film composite 6 may also be used as the substrate 10. When the barrier film composite 6 is used only to encapsulate the organic light-emitting device 20, the substrate 10 may include a flexible material, such as plastics or polyimides.

The organic light-emitting device 20 includes a first electrode layer 21, an organic emission layer 23, and a second electrode layer 25. A detailed description of the organic light-emitting device 20 will not be provided here, since it has already been described above in connection with the organic light-emitting display apparatus 100 of FIG. 2.

The organic light-emitting display device 200 including the barrier film composite 6 as described above may have a soft, elastic structure, enabling the manufacture of a flexible display. The barrier film composite 6 is less likely to crack, and thus may protect the organic emission layer 23 from external moisture and oxygen, even when cracking occurs, due to the pitch P extending between the second regions 620 and potential external contamination paths are elongated as the barrier film composite 6 is stretched.

The organic light-emitting display apparatus 200 may further include the layer 30 which is disposed between the organic light-emitting device 20 and the barrier film composite 6. The layer 30 may be a flexible layer.

Figure 9:
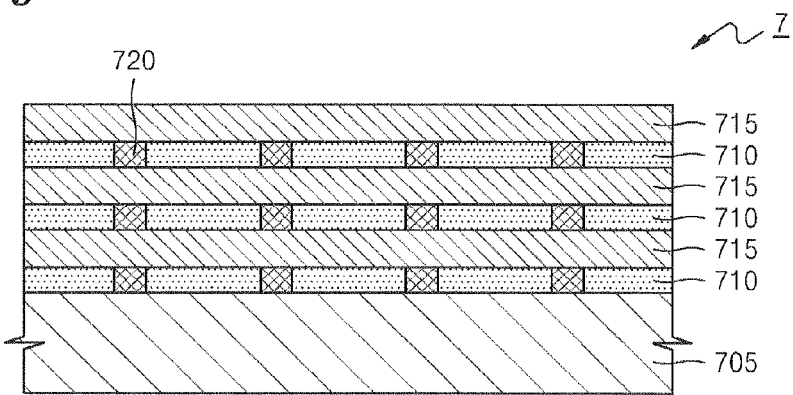
FIG. 9 is a cross sectional view illustrating a barrier film composite constructed as another embodiment of the present invention.

FIG. 9 illustrates a barrier film composite 7 according to another embodiment of the present invention.

Referring to FIG. 9, the barrier film composite 7 includes alternating layers of inorganic barrier layers 705 and decoupling layers 715 alternatingly disposed on a substrate 705. Metal ribs 720 may be disposed in the inorganic barrier layers 705, if partial loss of transparency is acceptable. Suitable materials for the metal ribs 720 include, but are not limited to, soft metals, alloys, tin (Sn), indium (In), and combinations thereof. The metal ribs 720 can be stretched without breaking. The metal ribs 720 may be two-dimensional.

Another method of making barrier film composites involves making the inorganic barrier layers out of a very ductile soft metal or metal alloy, such as tin. The multilayer structure will be semitransparent or even opaque, depending on the thickness and number of layers used. There are however many applications for the stretchable multilayer barrier which do not require a transparent barrier.

Another method of making barrier film composites is to cover the inorganic barrier layers with a thin layer of nanoparticles of an inorganic oxide or nitride. The inorganic barrier layer may crack when it is stretched, but the nanoparticles should reduce the effect of the cracks by increasing the length of the undulating path.

Another method of making barrier film composites is to stretch a soft substrate and deposit the inorganic barrier layers on the substrate while the soft substrate is being stretched. When the tension is released, the inorganic barrier layer will be compressed. This will allow some stretching of the inorganic layers when the structure is used.

As described above, according to the one or more embodiments of the present invention, a stretchable barrier film composite provides a soft, elastic polymer-based structure with an undulating surface, and a display apparatus may be manufactured using the flexible barrier film composite.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display apparatus, comprising:
a first substrate;
a second substrate disposed opposite to and spaced apart from the first substrate; and
a light-emitting device disposed between the first substrate and the second substrate,
wherein at least one of the first substrate and the second substrate comprises a barrier film composite,
wherein the barrier film composite comprises:
a film with an undulating surface and an opposite surface disposed opposite to the undulating surface; and
at least one decoupling layer and at least one barrier layer disposed on the undulating surface of the film,
wherein the film comprises a stretchable material.

2. The display apparatus of claim 1, wherein the undulating surface being closer to the light-emitting device than the opposite surface.

3. The display apparatus of claim 1, wherein the film comprises at least one selected from the group consisting of polyethylene, polypropylene, polycarbonate, and combinations thereof.

4. The display apparatus of claim 1, wherein the film comprises a first layer that is stretchable, and a second layer disposed on the first layer and the second layer having an undulating surface.

5. The display apparatus of claim 4, wherein the first layer comprises plastic, and the second layer comprises a soft monomer.

6. The display apparatus of claim 1, wherein the at least one decoupling layer comprises a cross-linked material with a low glass transition temperature.

7. The display apparatus of claim 6, wherein the decoupling layer comprises an acrylate.

8. The display apparatus of claim 1, wherein the barrier layer comprises at least one selected from the group consisting of individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof.

\* \* \* \* \*